United States Patent
Liu et al.

(10) Patent No.: US 10,734,228 B2
(45) Date of Patent: Aug. 4, 2020

(54) MANUFACTURING METHODS TO APPLY STRESS ENGINEERING TO SELF-ALIGNED MULTI-PATTERNING (SAMP) PROCESSES

(71) Applicant: Tokyo Electron Limited, Minato-ku, Tokyo (JP)

(72) Inventors: Eric Chih-Fang Liu, Albany, NY (US); Akiteru Ko, Albany, NY (US); David L. O'Meara, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 77 days.

(21) Appl. No.: 16/212,144

(22) Filed: Dec. 6, 2018

(65) Prior Publication Data

US 2019/0189445 A1  Jun. 20, 2019

Related U.S. Application Data

(60) Provisional application No. 62/607,781, filed on Dec. 19, 2017.

(51) Int. Cl.
| | |
|---|---|
| *H01L 21/033* | (2006.01) |
| *H01L 21/311* | (2006.01) |
| *H01L 23/00* | (2006.01) |
| *H01L 21/02* | (2006.01) |
| *H01L 21/308* | (2006.01) |

(52) U.S. Cl.
CPC ...... *H01L 21/0337* (2013.01); *H01L 21/0217* (2013.01); *H01L 21/3086* (2013.01); *H01L 21/31116* (2013.01); *H01L 23/564* (2013.01); *B81C 2201/0163* (2013.01); *B81C 2201/0171* (2013.01)

(58) Field of Classification Search
CPC ............ H01L 21/0337; H01L 21/3086; H01L 21/0217; B81C 2201/0161–0173
See application file for complete search history.

(56) References Cited

U.S. PATENT DOCUMENTS

| | | |
|---|---|---|
| 7,060,549 B1 | 6/2006 | Craig et al. |
| 7,670,931 B2 | 3/2010 | Shaviv |
| 7,968,915 B2 | 6/2011 | Kanarsky et al. |
| 8,889,560 B2 * | 11/2014 | Chung ............... H01L 21/0337 438/702 |
| 9,029,263 B1 * | 5/2015 | Kim .................. H01L 21/82343 438/694 |
| 9,368,393 B2 | 6/2016 | Gabriel |

(Continued)

*Primary Examiner* — Bac H Au
(74) *Attorney, Agent, or Firm* — Wood Herron & Evans LLP

(57) ABSTRACT

Embodiments are disclosed for processing microelectronic workpieces to apply stress engineering to self-aligned multi-patterning (SAMP) processes. The disclosed processing methods utilize stress in a substrate in a SAMP process to improve resulting pattern parameters. Initially, a high stress film is deposited on the frontside and the backside of the substrate, and the high stress film provides biaxial stress to the substrate due to the deposition process for the high stress film. Next, a SAMP process is performed to form spacers in a spacer pattern. This spacer pattern is then transferred to underlying layers to form a patterned structure. The high stress film provides axial stress in at least one direction along a portion of the patterned structure during the pattern transfer thereby improving resulting pattern formation.

20 Claims, 6 Drawing Sheets

(56) References Cited

U.S. PATENT DOCUMENTS

| | | | |
|---|---|---|---|
| 9,508,557 B2 | 11/2016 | Kang | |
| 9,659,784 B1 | 5/2017 | Petterson et al. | |
| 9,831,117 B2 * | 11/2017 | Wu | H01L 21/0217 |
| 9,852,916 B2 * | 12/2017 | Chen | C23C 16/45544 |
| 10,014,181 B2 * | 7/2018 | Lee | H01L 21/02164 |
| 10,325,778 B2 * | 6/2019 | Clevenger | H01L 21/3088 |
| 10,468,251 B2 * | 11/2019 | Ishikawa | H01L 21/0337 |
| 2005/0277289 A1 | 12/2005 | Ivagganer et al. | |
| 2008/0014688 A1 | 1/2008 | Thean et al. | |
| 2014/0273442 A1 * | 9/2014 | Liu | H01L 21/31111 |
| | | | 438/666 |
| 2015/0044826 A1 * | 2/2015 | Morin | H01L 29/7847 |
| | | | 438/157 |
| 2016/0181089 A1 | 6/2016 | Liang et al. | |
| 2016/0329207 A1 * | 11/2016 | Mohanty | H01L 21/324 |
| 2017/0076997 A1 * | 3/2017 | Reboh | H01L 21/02236 |
| 2017/0148635 A1 | 5/2017 | Bedell et al. | |
| 2018/0096846 A1 * | 4/2018 | Arnold | H01L 21/30604 |
| 2019/0157095 A1 * | 5/2019 | Zhou | H01L 21/0337 |

* cited by examiner

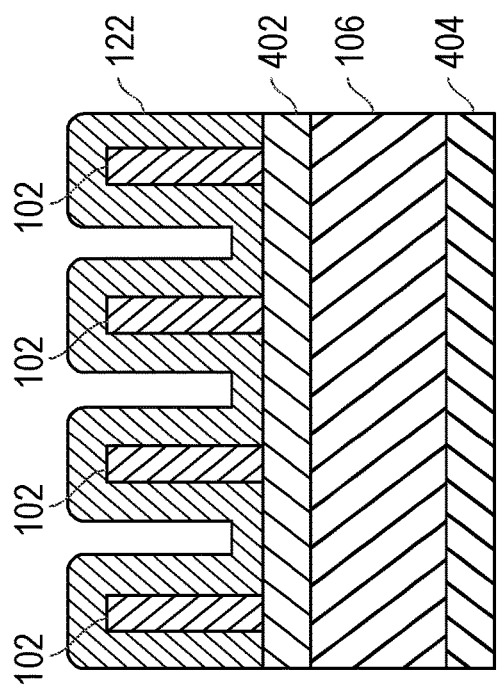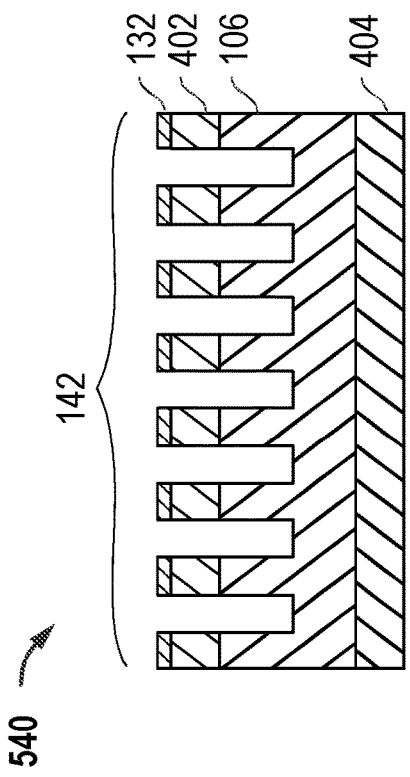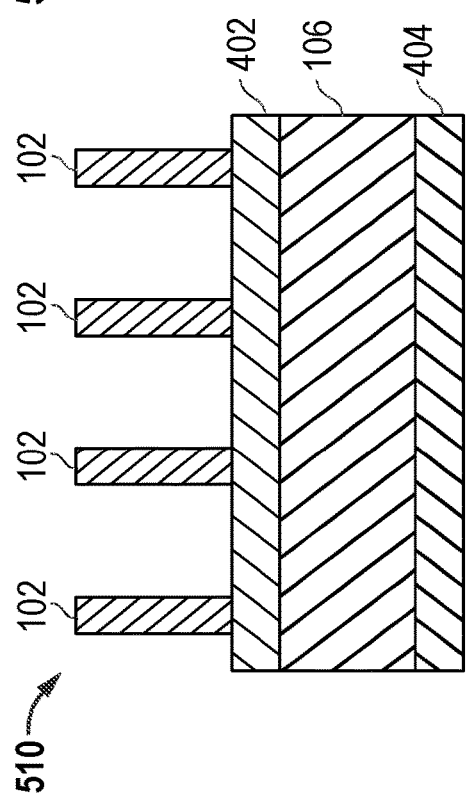
FIG. 5A
FIG. 5B
FIG. 5C
FIG. 5D

| Aspect Ratio | No Stress | 0.5 GPa | 1.24 GPa | 1.71 GPa |
|---|---|---|---|---|
| 6.4 | LWR 1.71 | LWR 1.1 | LWR 1.1 | LWR 1.04 |
| 8.7 | LWR 2.56 | LWR 1.26 | LWR 1.21 | LWR 1.12 |
| 13.3 | LWR 3.09 | LWR 1.29 | LWR 1.15 | LWR 1.15 |

MANUFACTURING METHODS TO APPLY STRESS ENGINEERING TO SELF-ALIGNED MULTI-PATTERNING (SAMP) PROCESSES

CROSS-REFERENCE TO RELATED APPLICATIONS

This application is related to and claims priority to U.S. Provisional Patent Application Ser. No. 62/607,781 filed on Dec. 19, 2017, the entire contents of which are herein incorporated by reference.

BACKGROUND

The present disclosure relates to methods for processing microelectronic workpieces, and in particular, methods for creating patterned structures on the microelectronic workpieces.

Semiconductor device formation involves a series of manufacturing techniques related to the formation, patterning and removal of a number of layers of material on a substrate. Over the last few decades, dimension shrinkage for device features has been the major driving force in the development of integrated circuit processing. By reducing the dimensions of feature sizes, substantial improvements have been achieved in reducing costs while boosting device performance. This reduction in feature size and related scalability, however, has created inevitable difficulties and complexities in manufacturing process flows especially with respect to patterning techniques used to achieve the reduced feature sizes.

Self-aligned multi-patterning (SAMP) techniques have been used to achieve reduced feature size in semiconductor processing beyond current photolithographic limits. For example, SAMP techniques have been used to achieve features sizes below 22 nanometers (nm) for Fin-Field-Effect-Transistor (FinFET) architectures. SAMP techniques use extra spacer formation and etch steps to achieve the pitch reduction needed to achieve these sub-22 nm structures. With respect to SAMP process flows, cores and spacers are two common hardmask materials that are used to obtain small feature sizes in advanced semiconductor processing techniques. For example, a conventional SAMP flow contains the following steps: core formation, spacer deposition, spacer etch, and core pull. In this approach, the final feature critical dimension (CD) is controlled by spacer deposition thickness and the physical features of the resulting spacer pattern. The spacer patterns are then transferred to underlying layers using further etch processes to form patterned structures.

At these small features size and particularly as feature sizes extend below 10 nm, roughness and uniformity controls for the deposition/etch processes used to form the spacer patterns and resulting pattern structures become extremely critical because roughness/uniformity variations can be a major source of process variations for such small dimension features. With the conventional SAMP techniques for these sub-10 nm nodes, for example, roughness has been found in patterned lines formed after pattern transfer of spacer patterns to underlying layers. These roughened patterned lines will carry undesired variations through subsequent process stages and eventually degrade the final features for the microelectronic workpiece being manufactured. Unlike direct patterning methods, improvement of line roughness is difficult and complicated due to the nature of SAMP techniques applied within complex process flows.

FIGS. 1A-D (Prior Art) provide example embodiments for a traditional process flow for a SAMP process that includes a core pull from spacers and a transfer of a spacer pattern to underlying layers.

Looking first to FIG. 1A (Prior Art), an example embodiment 110 for material layers and patterned structures is shown after lithography and etch processes (or prior SAMP processes) have been used to form cores 102 over underlying layers. For the example embodiment 110, the layers underneath the cores 102 include a hardmask layer 104 and a substrate 106, such as a semiconductor substrate for a microelectronic workpiece. Lithography processes can include optical lithography, extreme ultra-violet (EUV) lithography, and/or other desired lithography processes. Etch processes can include, for example, a reactive ion etching (RIE) process and/or other etch or strip processes that are used to form cores 102. The etch processes can include, for example, plasma etch processes having plasma gases containing fluorocarbons, oxygen, nitrogen, hydrogen, argon, and/or other gases under a variety of pressure and power conditions. In addition, this plasma etch can be done in multiple steps with different discharged plasmas for directionally etching to achieve the desired structures for cores 102.

It is noted that the cores 102 can include, for example, silicon, amorphous carbon, photoresist, and/or other materials. The hardmask layer 104 can be, for example, one or more of the following materials including but not limited to tetraethyl orthosilicate (TEOS), silicon oxide ($SiO_x$), low temperature silicon oxide, silicon nitride (SiN), sacrificial SiN, SiCOH, silicon oxynitride (SiON), and/or other hardmask materials. The substrate 106 can be silicon and/or other substrate materials being used for the microelectronic workpiece.

FIG. 1B (Prior Art) provides an example embodiment 120 after a deposition process has been performed to deposit spacer layer 122 over the cores 102. The spacer layer 122, for example, can be silicon oxide, silicon nitride, metal oxide, metal nitride, and/or other protective spacer material. In one embodiment, the spacer layer 122 is deposited using chemical vapor deposition (CVD), plasma enhanced CVD (PECVD), physical vapor deposition (PVD), atomic layer deposition (ALD), and/or other deposition processes. It is also noted that the ALD method of deposition is the typically preferred deposition technique for SAMP spacers because it is based on self-limiting atomic layer deposition, which provides for atomically uniform film formation.

FIG. 1C (Prior Art) provides an example embodiment 130 after a spacer open process has been performed to form spacers 132 adjacent the cores 102, and a core pull process has been performed to pull the cores 102 and leave spacers 132 in a spacer pattern 134. The spacer open process can be, for example, an etch process that etches the spacer layer 122 to form the spacers 132 adjacent to the cores 102, and the core pull process can be an etch process that etches the cores 102 to leave the spacers 132. This etch process and the core pull process can also be plasma etch processes as described above with chemistry based upon the materials used for the cores 102 and the spacer layer 122. The spacer pattern 134 can be later transferred to underlying layers such as hardmask 104 and substrate 106.

FIG. 1D (Prior Art) provides an example embodiment 140 after a pattern transfer process has been performed to transfer the spacer pattern 134 to a patterned structure 142 within the underlying layers such as hardmask 104 and substrate 106. The pattern transfer process can be, for example, etch processes that etch the spacers 132, the hardmask 104, and/or the substrate 106 to form the patterned structure 142. Depending upon the etch processes used, a portion of the spacers 132 can be left as part of the patterned structure 142 transferred to the underlying layers from the spacer pattern 134. This etch processes for the pattern transfer can also be plasma etch processes as described above.

The resulting patterned structure 142 often includes pattern lines that extend longitudinally across the surface of the microelectronic workpiece being manufactured. As described above, traditional deposition/etch manufacturing processes lead to unacceptable roughness and/or non-uniformity in the pattern lines for small feature sizes such as features sizes below 22 nm and, more particularly, for features sizes below 10 nm.

SUMMARY

Embodiments are described for processing microelectronic workpieces to apply stress engineering to SAMP processes. Variations can also be implemented while still taking advantage of the techniques described herein.

For one embodiment, a method is disclosed to utilize stress in a substrate in a SAMP process, the substrate having a frontside and a backside. The method includes depositing a high stress film on the frontside and the backside of the substrate where the high stress film provides biaxial stress to the substrate due to the deposition process for the high stress film, performing a SAMP process to form spacers in a spacer pattern, and transferring the spacer pattern to underlying layers to form a patterned structure where the high stress film provides axial stress in at least one direction along a portion of the patterned structure during the transfer.

In additional embodiments, the patterned structure includes pattern lines; the high stress film provides axial stress in a longitudinal direction along the pattern lines; and the axial stress is a stress of greater than 0.5 Giga Pascals (GPa). In further embodiments, the pattern lines have a line width roughness (LWR) of less than 1.6. In still further embodiments, the pattern lines have a line width roughness (LWR) of less than 1.2.

In additional embodiments, the axial stress is a stress of greater than 1.0 GPa. In further embodiments, the pattern lines have an aspect ratio greater than 5.0.

In additional embodiments, the axial stress is a stress of greater than 1.25 GPa. In further embodiments, the pattern lines have an aspect ratio greater than 7.0.

In additional embodiments, the patterned structure includes a feature size of less than 22 nanometers, and the axial stress is a stress greater than 0.5 GPa. In further additional embodiments, the patterned structure includes a feature size of less than 10 nanometers, and the axial stress is a stress greater than 0.5 GPa.

In additional embodiments, the method includes controlling operating variables for the depositing to meet a target parameter for the biaxial stress. In further additional embodiments, the method includes controlling operating variables for the performing and transferring to ensure that the patterned structure meets target parameters for line roughness.

In additional embodiments, the SAMP process includes performing a core definition process to form cores on the frontside of the substrate and forming spacers in the spacer pattern based upon the cores. In further embodiments, the forming spacers includes depositing a spacer layer over the cores, etching the spacer layer to form spacers, and performing a further etch to pull the cores and leave the spacers in the spacer pattern.

In additional embodiments, the transferring includes etching the high stress film on the frontside of the substrate between the spacers and etching the substrate between the spacers. In further embodiments, the method includes comprising removing the spacers.

In additional embodiments, the patterned structure includes pattern lines; the patterned lines have a feature size of less than 10 nanometers; the pattern lines have an aspect ratio of greater than 5.0; and the axial stress is a stress of greater than 1.0 GPa. In further additional embodiments, the patterned structure includes pattern lines; the patterned lines have a feature size of less than 10 nanometers; the pattern lines have an aspect ratio of greater than 7.0; and the axial stress is a stress of greater than 1.25 GPa.

In additional embodiments, the depositing includes depositing a first high stress film on the backside of the substrate and depositing a second high stress film on the frontside of the substrate where the second high stress film matches the first high stress film. In further additional embodiments, the depositing includes depositing a first high stress film on the backside of the substrate and depositing a second high stress film on the frontside of the substrate where the second high stress film is different from the first high stress film.

Different or additional features, variations, and embodiments can be implemented, if desired, and related systems and methods can be utilized, as well.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

FIGS. 5A-D provide example embodiments for a process flow for a SAMP process where high stress films have been previously deposited on the frontside and the backside of a substrate for a microelectronic workpiece.

FIG. 6 is a table that provides LWR (line width roughness) parameters achieved based upon axial stress applied by high stress films with respect to various aspect ratios (AR) for pattern lines formed on the frontside of a silicon substrate in accordance with an embodiment of the invention.

DETAILED DESCRIPTION

Embodiments are described for processing microelectronic workpieces to apply stress engineering to self-aligned multi-patterning (SAMP) processes.

As the semiconductor device industry moves to ever smaller critical dimensions, the necessity of developing new process flows that meet or exceed electrical, physical, and reliability specifications for the current and next generation devices has increased. As described above, multi-patterning processes such as SAMP processes rely heavily upon physical profile and critical dimension (CD) control of spacers to generate desired patterns that are transferred to underlying layers. In contrast to direct patterning processes, line roughness and variations are difficult to control for these SAMP processes that rely upon patterned spacers. As features sizes are reduced, the line roughness and variations have an increasingly greater negative impact to the process margin and device properties.

To overcome problems experienced by prior manufacturing processes, the disclosed embodiments deposit films having high biaxial stress to the frontside and backside of a substrate for a microelectronic workpiece prior to the deposition/etch processes that are used to form the spacer patterns in SAMP processes. These high stress films provide additional tensile stress that helps to straighten pattern lines and reduce line roughness for patterns transferred from spacer patterns to underlying layers. This use of stress engineering through the deposition of a high stress material improves physical performance and process results for the microelectronic workpiece. For one embodiment, the deposition of a high stress film on the frontside and backside of a substrate (e.g., silicon substrate) adds additional axial stress in a least one direction for frontside patterns, and this additional axial stress reduces roughness and variations in pattern lines particularly for silicon etch processes. Further, the amount and direction of the stress can be manipulated to further improve frontside patterns results by controlling operating variables during the deposition of the high stress films. The disclosed stress engineering techniques can be applied to almost all SAMP processes to improve pattern results. Other variations can also be implemented while still taking advantage of the stress engineering techniques described herein.

Figure 1B:
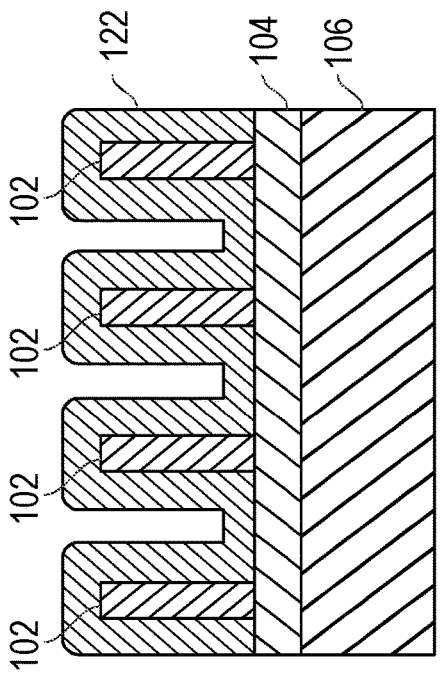
FIGS. 1A-D (Prior Art) provide example embodiments for a traditional process flow for a self-aligned multi-patterning (SAMP) process that includes a core pull from spacers and a transfer of a spacer pattern to underlying layers.
Figure 1A:
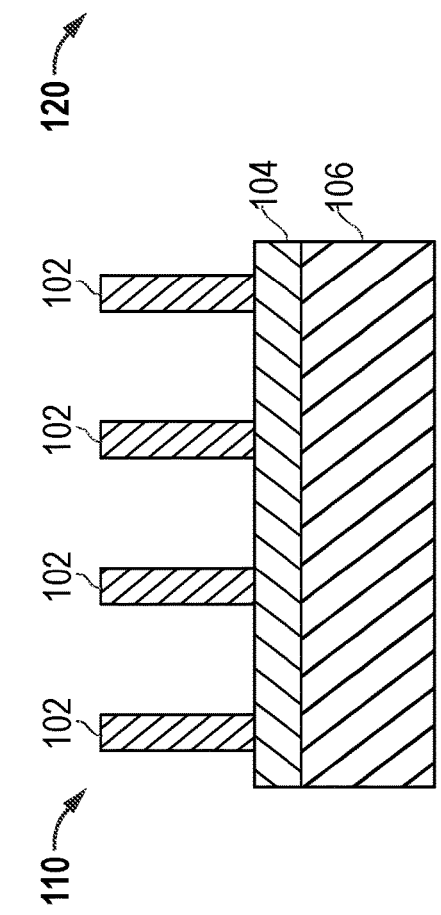
Figure 1D:
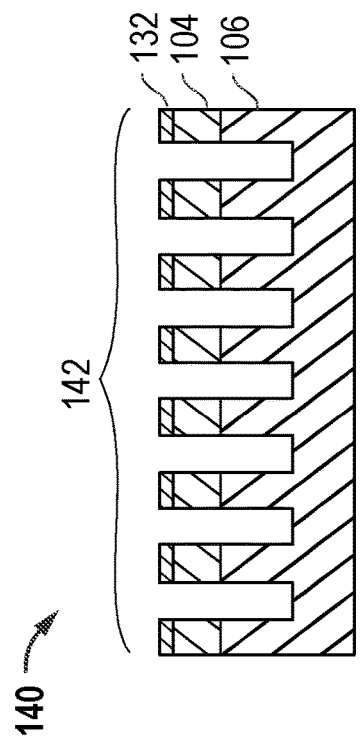
Figure 1C:
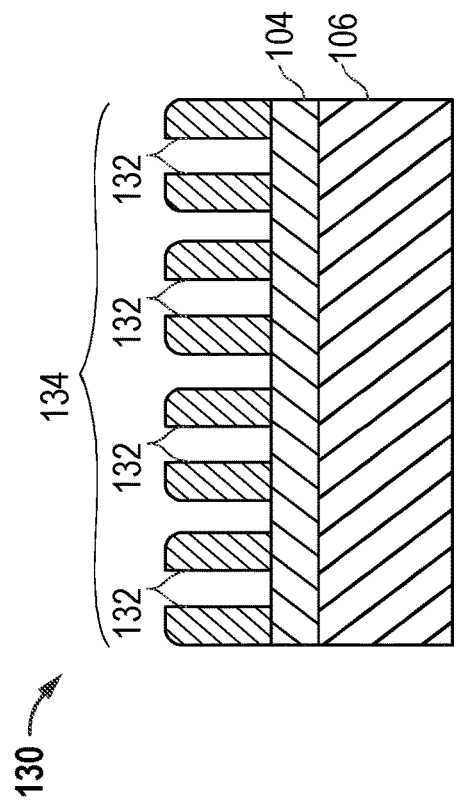
Figure 2:
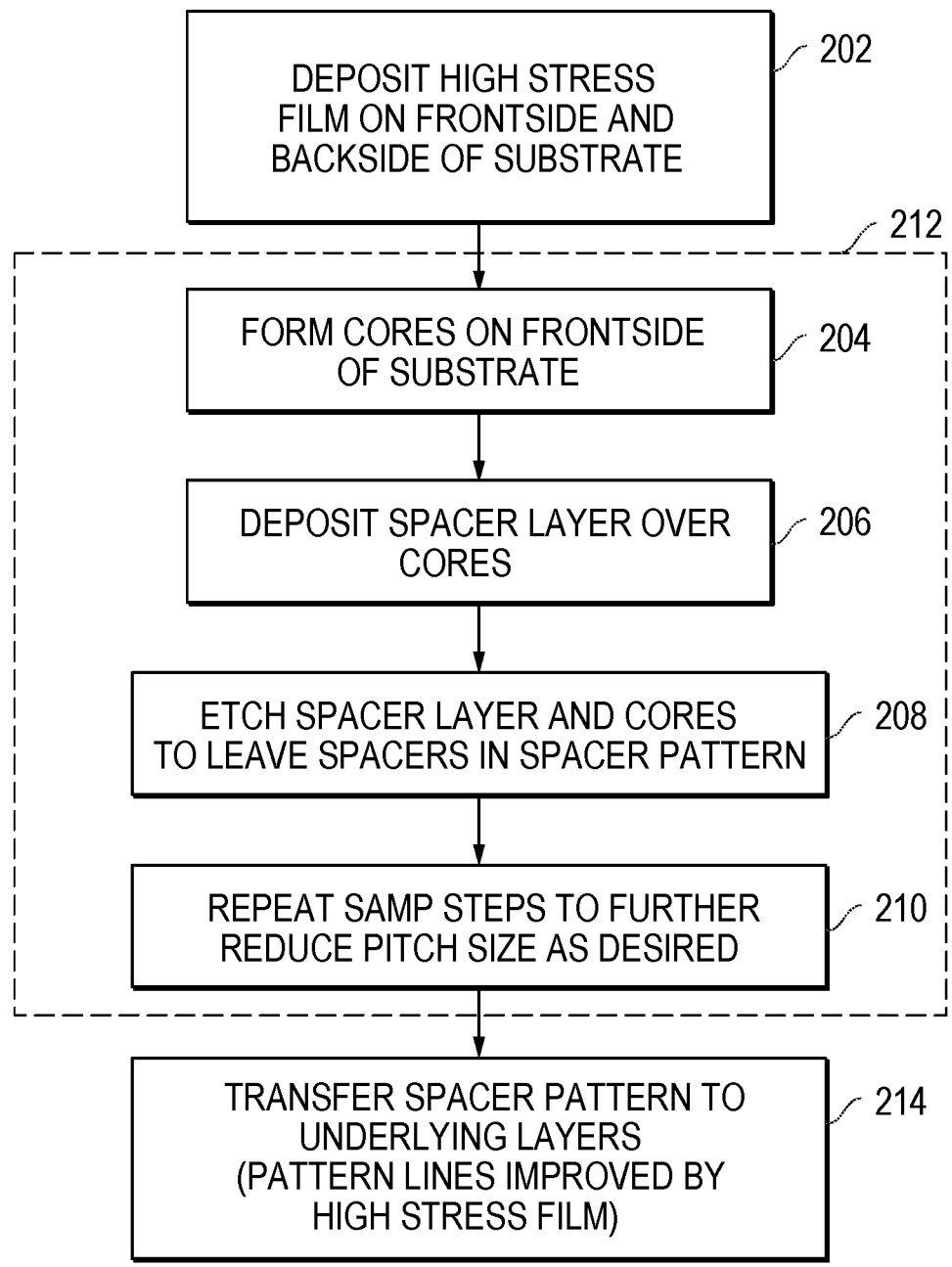
FIG. 2 is a process flow diagram of an example embodiment that applies films with high tensile stress to the frontside and backside of a substrate for a microelectronic workpiece to improve patterns formed through SAMP processes.

FIG. 2 is a process flow diagram of an example embodiment 200 that applies films with high tensile stress to the frontside and backside of a substrate for a microelectronic workpiece to improve patterns formed through SAMP processes. In step 202, a high stress film is deposited on the frontside and the backside of the substrate for the microelectronic workpiece. The high stress film can be, for example, silicon oxide, silicon nitride, metal, metal oxide, and/or other material that is deposited under process parameters. Further, the high stress film can be deposited such that the deposited material provides a biaxial stress of greater than 0.5 Giga Pascals (GPa). It is noted that the inherent stress of a film can be controlled by process conditions during deposition and/or by the film composition. For example, boron concentration in silicon nitride (SiN) films is one example of film stress control by composition where low boron concentrations can increase film stress up to about 1.2 GPa, and high boron concentrations can reduce film stress down to about 300 GPa. More generally, reducing impurities in deposited films can be used to increase resulting film stress, and increasing impurities in deposited films can be used to decrease resulting film stress. As a further example, process conditions such as temperature and pressure can be used to control film stress for different film types (e.g., SiO2, SiN) and deposition techniques (e.g., CVD, ALD). The actual patterning benefit from stress controlled films is from the amount of strain induced by the stress, or the amount the lines are stretched, which relates to the degree wafers are bowed by the stress. Consequently, the amount of strain or wafer bow is determined by the thickness of the film as well as the stress. As such, process conditions as well as film composition and thickness can be used and controlled to determine the stress provided by the deposited films.

After the high stress film has been deposited, the substrate can subsequently be processed using conventional SAMP process flows including core definition, spacer deposition, and spacer etch along with subsequent pattern transfer processes. For the example embodiment 200, the SAMP process flow 212 includes steps 204, 206, 208, and 210. Initially, core formation is provide in step 204 where cores are formed on the frontside of the substrate. For this core formation, lithography can be applied to print a pattern, and this pattern can be transferred to core material through one or more etch processes. It is also noted that this core formation can also include precise control of critical dimension (CD) and feature profile to improve final features for the microelectronic workpiece. In step 206, a spacer layer is deposited over the cores. This spacer layer deposition can use atomic layer deposition (ALD) and/or another conformal film deposition technique that preferably provides uniform film coverage for the spacer layer. After this spacer layer deposition, etch processes (e.g., plasma etch) are used in step 208 to etch the spacer layer and to pull the cores to leave spacers in a spacer pattern. As is the case for SAMP processes, the resulting spacer pattern defines features that are half the pitch of the original pitch for the cores. By repeating of the core/spacer formation steps 204, 206, and 208 as indicated by step 210, the pitch halving can effectively be multiplied to achieve $2^N$ division in the reduction to feature size where "N" is the number of times the core/spacer patterning is conducted.

After the SAMP process flow 212 has completed, one or more subsequent process steps can be used to transfer the resulting spacer pattern to underlying layers as indicated by step 214. The pattern transfer can include, for example, etch processes applied to the high stress film, to the substrate, and/or to other layers underlying the spacer pattern. It is noted that additional and/or different process steps can be used while still taking advantage of the techniques described herein that apply high stress films to improve pattern transfer and parameters for resulting pattern lines.

It is also noted that the operating variables for the depositing in step 202, the SAMP process flow 212, and/or the pattern transfer of step 214 can be controlled to ensure that target parameters are achieved. For example, the operating variables can be controlled for the deposition of the high stress film such that the biaxial stress applied by the high stress film meets target stress parameters. For example, the operating variables can be controlled to ensure that the biaxial stress is greater than 0.5 Giga Pascals (GPa). In addition, the operating variables for the SAMP process flow 212 and the pattern transfer in step 214 can be controlled such that the resulting patterned structures after pattern transfer meet target parameters for line roughness and feature uniformity. The operating variables controlled may include, for example, the chamber temperature, chamber pressure, flowrates of gases, frequency and/or power applied to electrode assembly in the generation of plasma, and/or other operating variables for the processing steps. For example, the operating variables can be controlled to ensure that the line width roughness (LWR) for the pattern structure after pattern transfer meets a target LWR of below 1.6 and preferably below 1.2. In further preferred embodiments, the patterned structures have a feature size of less than 10 nm. It is noted additional and/or different target parameters can be used while still taking advantage of the techniques described herein that apply high stress films to improve pattern transfer and parameters for resulting pattern lines.

Example process flows for the disclosed embodiments are described in more detail below with respect to FIGS. 4A-C and FIGS. 5A-D, although a wide variety of process flows can be implemented while still taking advantage of the techniques described herein. Before these example process flows are discussed, an embodiment 300 for an example plasma etch processing system is described with respect to FIG. 3. It is noted, however, that the techniques described herein may be utilized with a wide range of etch processing systems, and the embodiment 300 is simply one example embodiment.

Figure 3:
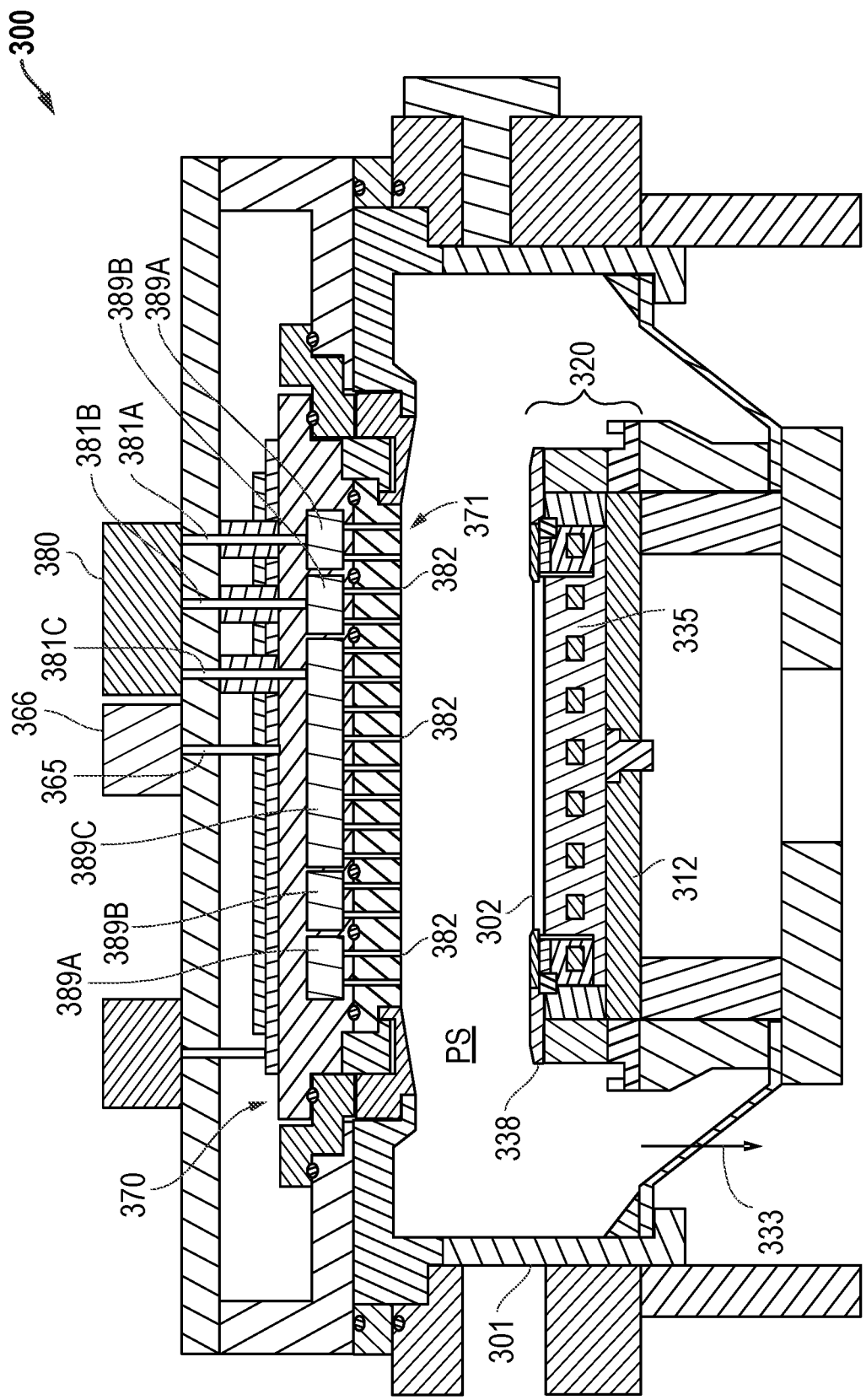
FIG. 3 is a block diagram of an example embodiment for a workpiece manufacturing system, such as a plasma processing apparatus, that can be used as an etch chamber for the embodiments described herein.

FIG. 3 is a block diagram of an example embodiment 300 for a workpiece manufacturing system, such as a plasma processing apparatus, that can be used as an etch chamber for the embodiments described herein. More particularly, FIG. 3 illustrates one example embodiment for a plasma processing apparatus merely for illustrative purposes that can be used to implement the processing techniques described herein. It will be recognized that other plasma process systems and other etch process systems may equally implement the techniques described herein. For the example embodiment 300 of FIG. 3, a schematic cross-sectional view is provided for a capacitively coupled plasma processing apparatus including a process space (PS) that provides an etch chamber for microelectronic workpieces. Alternative plasma process apparatus may also be utilized, including for example, but not limited to, inductively coupled plasma processing apparatus, microwave plasma processing apparatus, and the like. A capacitively coupled plasma processing apparatus may be particularly well suited as the electrode spacing of such apparatus allow beneficial control of gases to a localized region of the plasma space, thus providing localized plasma processing on the substrate.

The plasma processing apparatus 300 can be used for multiple operations including ashing, etching, deposition, cleaning, plasma polymerization, plasma-enhanced chemical vapor deposition (PECVD), atomic layer deposition (ALD) and so forth. The structure of a plasma processing apparatus 300 is well known, and the particular structure provided herein is merely exemplary. Plasma processing can be executed within processing chamber 301, which can be a vacuum chamber made of a metal such as aluminum or stainless steel. The processing chamber 301 defines a processing vessel providing a process space (PS) for plasma generation. An inner wall of the processing vessel can be coated with alumina, yttria, or other protectant. The processing vessel can be cylindrical in shape or have other geometric configurations.

At a lower, central area within the processing chamber 301, a susceptor 312 (which can be disc-shaped) can serve as a mounting table on which, for example, a substrate 302 to be processed (such as a semiconductor wafer) can be mounted. Substrate 302 can be moved into the processing chamber 301 through a loading/unloading port and gate valve. Susceptor 312 forms part of a lower electrode assembly 320 as an example of a second electrode acting as a mounting table for mounting substrate 302 thereon. The susceptor 312 can be formed of, e.g., an aluminum alloy. Susceptor 312 is provided thereon with an electrostatic chuck (as part of the lower electrode assembly) for holding the substrate 302. The electrostatic chuck is provided with an electrode 335. Electrode 335 is electrically connected to direct current (DC) power source, not shown. The electrostatic chuck attracts the substrate 302 thereto via an electrostatic force generated when DC voltage from the DC power source is applied to the electrode 335. The susceptor 312 can be electrically connected with a high-frequency power source via a matching unit. For other embodiments and processing chambers, two or more power sources can be used and connected to electrode 335 and/or other electrodes within the processing chambers. This high-frequency power source (a second power source) can output a high-frequency voltage in a range from, for example, 2 MHz to 20 MHz. Applying high frequency bias power causes ions, in plasma generated in the processing chamber 301, to be attracted to substrate 302. A focus ring assembly 338 is provided on an upper surface of the susceptor 312 to surround the electrostatic chuck.

An exhaust path 333 can be formed through one or more exhaust ports (not shown) which connect to a gas exhaust unit. The gas exhaust unit can include a vacuum pump such as a turbo molecular pump configured to pump out the plasma processing space within the processing chamber 301 to a desired vacuum condition. The gas exhaust unit evacuates the inside of the processing chamber 301 thereby depressurizing the inner pressure thereof down to the desired degree of vacuum.

An upper electrode assembly 370 is an example of a first electrode and is positioned vertically above the lower electrode assembly 320 to face the lower electrode assembly 320 in parallel. The plasma generation space or process space (PS) is defined between the lower electrode assembly 320 and the upper electrode assembly 370. The upper electrode assembly 370 includes an inner upper electrode 371, having a disk shape, and an outer upper electrode which may be annular and surrounding a periphery of the inner upper electrode 371. The inner upper electrode 371 also functions as a processing gas inlet for injecting a specific amount of processing gas into the process space (PS) above substrate 302 mounted on the lower electrode assembly 320. The upper electrode assembly 370 thereby forms a showerhead. More specifically, the inner upper electrode 371 includes gas injection openings 382.

The upper electrode assembly 370 may include one or more buffer chamber(s) 389A, 389B, and 389C. The buffer chambers are used for diffusing process gas and can define a disk-shaped space. Processing gas from a process gas supply system 380 supplies gas to the upper electrode assembly 370. The process gas supply system 380 can be configured to supply a processing gas for performing specific processes, such as film-forming, etching, and the like, on the substrate 302. The process gas supply system 380 is connected to gas supply lines 381A, 381B, and 381C forming a processing gas supply path. The gas supply lines are connected to the buffer chambers of the inner upper electrode 371. The processing gas can then move from the buffer chambers to the gas injection openings 382 at a lower surface thereof. A flow rate of processing gas introduced into the buffer chambers 389A-C can be adjusted by, e.g., by using a mass flow controller. Further, the processing gas introduced is discharged from the gas injection openings 382 of the electrode plate (showerhead electrode) to the process space (PS). The inner upper electrode 371 functions in part to provide a showerhead electrode assembly.

As shown in FIG. 3, three buffer chambers 389A, 389B, and 389C are provided corresponding to edge buffer chamber 389A, middle buffer chamber 389B, and center buffer chamber 389C. Similarly, gas supply lines 381A, 381B, and 381C may be configured as edge gas supply line 381A, middle gas supply line 381B and center gas supply line 381C. The buffer chambers are provided in a manner corresponding to different localized regions of the substrate in this case edge, middle and center. As will be discussed more below, these regions may correspond to specific process plasma process conditions for localized regions of the substrate 302. It will be recognized that the use of three localized regions is merely exemplary. Thus, the plasma processing apparatus may be configured to provided localize plasma process conditions on any number of regions of the substrate. It is further again noted that any of a variety of configurations may be utilized, and the techniques described herein are not limited to the manner in which the process gas supply system 380 is configured to split the gas flows to the various buffer chambers.

The upper electrode assembly 370 is electrically connected with a high-frequency power source (not shown) (first high-frequency power source) via a power feeder 365 and a matching unit 366. The high-frequency power source can output a high-frequency voltage having a frequency of 40 MHz (megahertz) or higher (e.g., 60 MHz), or can output a very high frequency (VHF) voltage having a frequency of 30-300 MHz. This power source can be referred to as the main power supply as compared to a bias power supply. It is noted for certain embodiments there is no power source for the upper electrodes, and two power sources are connected to the bottom electrode. Other variations could also be implemented.

Components of the plasma processing apparatus can be connected to, and controlled by, a control unit, which in turn can be connected to a corresponding memory storage unit and user interface (all not shown). Various plasma processing operations can be executed via the user interface, and various plasma processing recipes and operations can be stored in a storage unit. Accordingly, a given substrate can be processed within the plasma processing chamber with various microfabrication techniques. In operation, the plasma processing apparatus uses the upper and lower electrodes to generate a plasma in the process space (PS). This generated plasma can then be used for processing a target substrate (such as substrate 302 or any material to be processed) in various types of treatments such as plasma etching, chemical vapor deposition, treatment of semiconductor material, glass material and large panels such as thin-film solar cells, other photovoltaic cells, and organic/inorganic plates for flat panel displays, etc.

Looking now to FIGS. 4A-C and FIGS. 5A-D, example process flow embodiments are provided that deposit high stress films to substrates to improve feature parameters, such as reduced roughness, for pattern lines formed using SAMP process flows. It is noted that the patterned structures and features shown in these embodiments are merely example patterned structures and features, and the disclosed techniques can be used for other patterned structures and features as well. It is further noted that additional and/or different process steps to those shown can also be implemented with respect to the microelectronic workpiece being manufactured while still taking advantage of the techniques described herein.

Figure 4A:
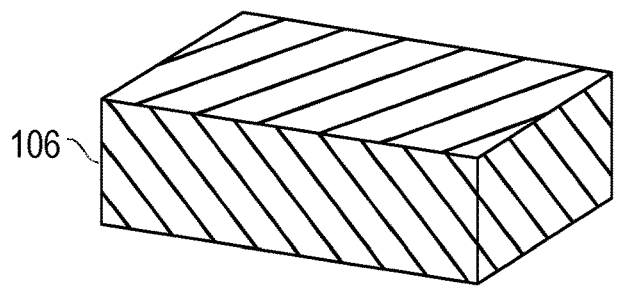
FIGS. 4A-C provide an example process flow where high stress films are deposited on the frontside and the backside of a substrate for a microelectronic workpiece to provide biaxial tension that improves feature parameters such as pattern line roughness for patterned structures formed using SAMP processes.
Figure 4B:
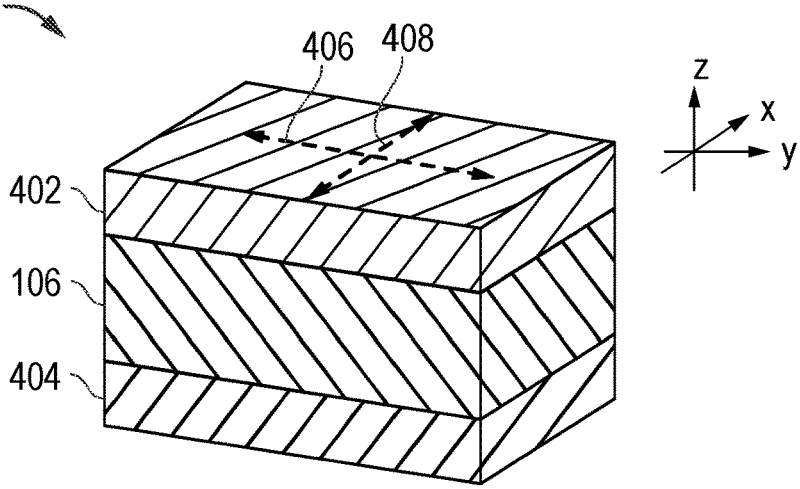
Figure 4C:
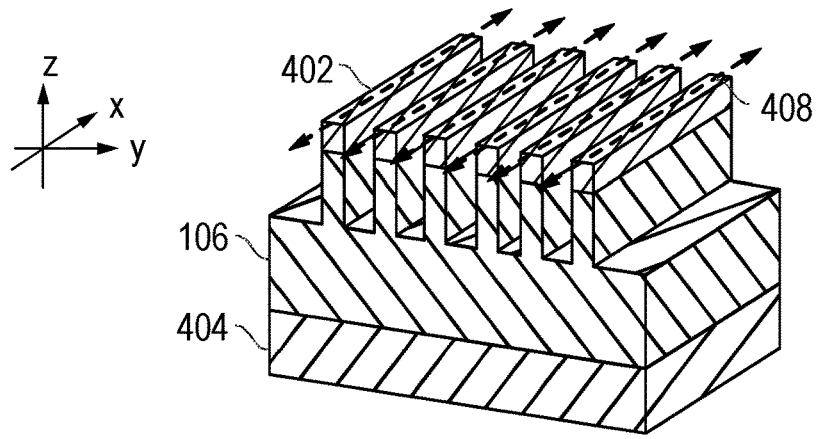

FIGS. 4A-C provide an example process flow where high stress films are deposited on the frontside and the backside of a substrate for a microelectronic workpiece to provide biaxial tension that improves feature parameters such as pattern line roughness for patterned structures formed using SAMP processes.

Looking first to FIG. 4A, provides an example embodiment 410 for a substrate 106 for the microelectronic workpiece. The substrate 106 can be silicon and/or other materials that are used to provide a substrate material for the manufacture of a microelectronic workpiece using a SAMP process flow.

FIG. 4B is an example embodiment 420 after a high stress film 404 has been deposited on the backside of the substrate 106 and after a high stress film 402 has been deposited on the frontside of the substrate 106. The high stress films 402 and 404 provide biaxial tensile stress to the substrate 106 as represented by tensile stress 408 along a first axis (e.g., x-axis) and as represented by tensile stress 406 along a second axis (e.g., y-axis). The high stress films 402 and 404 can be, for example, one or more of the following materials including but not limited silicon nitride, silicon oxide, metal oxide, and/or other material that are deposited under process parameters such that the deposited material meet a target parameter for biaxial tensile stress. For example, the biaxial stress applied by the high stress films 402/404 to the substrate 106 can be greater than 0.5 GPa. As previously mentioned, the film stress can be controlled by film composition or method of deposition, and the degree of strain is determined by film stress and thickness of film relative to the substrate thickness. It is noted that a first high stress film can be deposited on the backside of the substrate, and a second high stress film can be deposited on the frontside of the substrate. Further, the second high stress film can be the same and match the first high stress film, or the second high stress film can be different from the first high stress film.

For one embodiment, the high stress film 402 and the high stress film 404 can be deposited by several methods including chemical vapor deposition (CVD), plasma enhanced CVD (PECVD), or atomic layer deposition (ALD), with stress controlled by film composition and/or process conditions such as deposition chemistry, plasma power and/or process temperature. The target stress value can be an optimization between highest stress achievable to maximize the impact of LWR smoothing, and the possible negative impacts of excessive stress, such as film delamination, stress-induced defects such as dislocations, and excessive stress-induced wafer bow causing detrimental effects on photolithography and wafer handling.

FIG. 4C is an example embodiment 430 after a SAMP process flow has been used to perform core definition to form cores having a core pitch, to form spacers and pull cores in order to leave a spacer pattern having a pitch smaller than the original core pitch, and to transfer the spacer pattern into underlying layers to form a patterned structure including pattern lines. For the example embodiment 430, pattern lines have been formed that extend longitudinally along the x-axis direction and have a width along the y-axis that is significantly shorter. Due to these pattern lines, the remaining portions of the high stress film 402 on the frontside of the substrate 106 provide a tensile stress 408 in the x-direction along the longitudinal length of the pattern lines.

As described herein, the pattern lines formed from the pattern transfer of the spacer pattern 134 to underlying layers have improved roughness parameters based upon the biaxial stress provided by the high stress films 402/404 deposited on the substrate 106. The high stress films 402/404 applied to the substrate 106 provide additional biaxial stress in the frontside of the microelectronic workpiece by bending of the substrate 106 for the microelectronic workpiece (e.g., silicon wafer). Where the width of pattern lines is significantly smaller than the length of the pattern lines, this additional stress can be assumed as an axial stress along the longitudinal direction of the pattern lines for the resulting patterned structure. The stress of width direction for the pattern lines (e.g., perpendicular direction to the direction of the pattern lines) will effectively become zero due to stress relaxation of the film because of the small width dimension. With this strong axial stress in a single longitudinal direction, the frontside pattern lines for the patterned structure 142 tend to deform and straighten by obeying the mechanical stress-strain correlation along the longitudinal length of the pattern lines. This straightening of the pattern lines results in substantial improvements in reducing pattern roughness thereby improving line width roughness (LWR) parameters and/or line edge roughness (LER) parameters for the resulting patterned structures.

With reference to FIG. 6, this figure illustrates one example for LWR (line width roughness) parameters achieved based upon axial stress applied by high stress films 402/404 with respect to various aspect ratios (AR) for pattern lines formed on the frontside of a silicon substrate. The aspect ratio represents the height of the pattern lines with respect to the width of the pattern lines (e.g., AR=height of feature/width of feature). The example aspect ratios in the TABLE below are 6.4, 8.7, and 13.3, respectively. The example axial stress levels in FIG. 6 are no stress, 0.5 GPa, 1.24 GPa, and 1.71 GPa. As can be seen from FIG. 6, a greater axial stress for higher aspect ratios helps to achieve lower LWR levels. It is further noted that FIG. 6 provides only one example for axial stress values for example aspect ratios and resulting LWR values. Variations can be used while still taking advantage of the high stress film techniques described herein.

For the disclosed embodiments, it is desirable to apply axial stress of greater than 0.5 GPa using the high stress films 402/404. For an aspect ratio for patterned structures of greater than 5.0, it is desirable to apply an axial stress of greater than 1.0 using the high stress films 402/404. For an aspect ratio for patterned structures of greater than 7.0, it is desirable to apply an axial stress of greater than 1.25 using the high stress films 402/404. Further, it is preferred to have an LWR value of less than 1.2 (represented generally by underline and bold outline in FIG. 6), acceptable to have an LWR between 1.2 and 1.6 (represented generally by underline only in FIG. 6), and typically undesirable to have an LWR of greater than 1.6, particularly where features sizes are below 10 nm.

It is further noted that the aspect ratio (AR) for a patterned structure can be determined by dividing the height of the patterned structure by the width of the patterned structure. The LWR value for a pattern line within a patterned structure can be calculated as the standard deviation of a section of a line pattern. Higher LWR values indicate that pattern lines have more wiggle or variation, while lower LWR values indicate that the pattern lines have less wiggle or variation. The biaxial stress provided by high stress films 402/404 and the axial stress provided by the high stress films 402/404 to pattern lines can be determined by the tensile stress generated by the film along the surface of the film. One accepted technique for axial stress measurements for a film is determined by bow measurements of the substrate before and deposition of the film where the bow difference is plotted into Stoney's formula to calculate the film stress, which is well known and commonly used to infer film stress from measurements of substrate curvature.

FIGS. 5A-D provide example embodiments for a process flow for a self-aligned multi-patterning (SAMP) process where high stress films have been previously deposited on the frontside and the backside of a substrate for a microelectronic workpiece.

Looking first to FIG. 5A, an example embodiment 510 for material layers and patterned structures is shown after lithography and etch processes have been used to form cores 102 over underlying layers. For the example embodiment 510, the layers underneath the cores 102 include a high stress film 402 that was previously deposited on the frontside of substrate 106, such as a semiconductor substrate for a microelectronic workpiece. As described herein, a high stress film 404 is also previously deposited on the backside of the substrate 106. Lithography processes can include optical lithography, extreme ultra-violet (EUV) lithography, and/or other desired lithography processes. Etch processes can include, for example, a reactive ion etching (RIE) process and/or other etch or strip process that are used to form cores 102. The etch processes can include plasma etch processes having plasma gases containing fluorocarbons, oxygen, nitrogen, hydrogen, argon, and/or other gases under a variety of pressure and power conditions. In addition, this plasma etch can be done in multiple steps with different discharged plasmas for directionally etching to achieve the desired structures for cores 102.

It is noted that the cores 102 can include, for example, silicon, amorphous carbon, photoresist, and/or other materials. The high stress films 402 and 404 can be, for example, one or more of the following materials including but not limited silicon nitride, silicon oxide, metal oxide, and/or other material that are deposited under process parameters such that the deposited material provide a desired biaxial stress. For example, a biaxial stress of greater than 0.5 GPa in each axial direction along the surface of the substrate 106 can be provided by the high stress films 402/404. The substrate 106 can be silicon and/or other materials being used for the microelectronic workpiece.

FIG. 5B provides an example embodiment 520 after a deposition process has been performed to deposit spacer layer 122 over the cores 102. The spacer layer 122, for example, can be silicon oxide, silicon nitride, metal oxide, metal nitride layer, and/or other protective spacer material. In one embodiment, the spacer layer 122 is be deposited using chemical vapor deposition (CVD), plasma enhanced CVD (PECVD), physical vapor deposition (PVD), atomic layer deposition (ALD), and/or other deposition processes.

FIG. 5C provides an example embodiment 530 after a spacer open process has been performed to form spacers 132 adjacent the cores 102, and a core pull process has been performed to pull the cores 102 in order to leave spacers 132 in a spacer pattern 134. The spacer open process can be, for example, an etch process that etches the spacer layer 122 to form the spacers 132 adjacent to the cores 102. The core pull process can be, for example, an etch process that etches the cores 102 to leave the spacers 132 in the spacer pattern 134. This etch process and the core pull process can also be plasma etch processes as described above with chemistry based upon the materials used for the cores 102 and the spacer layer 122. For one embodiment, the spacer etch and core pull etch processes are plasma etch processes that use gases including one or more of nitrogen ($N_2$), oxygen ($O_2$), carbon monoxide (CO), carbon dioxide ($CO_2$), hydrogen ($H_2$), hydrogen bromide (HBr), chlorine ($Cl_2$), methane ($CH_4$), argon (Ar), helium (He), carbon hydrogen fluorides ($C_xH_yF_z$), carbon fluorides ($C_xF_y$), and/or other desired gases under a variety of pressure and power conditions.

FIG. 5D provides an example embodiment 540 after a pattern transfer process has been performed to transfer the spacer pattern 134 to a patterned structure 142 within the underlying layers such as high stress film 402 and substrate 106. The pattern transfer process can be, for example, etch processes that etch the spacers 132, the high stress film 402, and the substrate 106 to form the patterned structure 142. Depending upon the etch processes, a portion of the spacers 132 can be left as part of the patterned structure 142 transferred to the underlying layers. These etch processes for the pattern transfer can also be plasma etch processes as described above. For one embodiment, the high stress film etch and the substrate etch are plasma etch processes that use gases including one or more of nitrogen ($N_2$), oxygen ($O_2$), carbon monoxide (CO), carbon dioxide ($CO_2$), hydrogen ($H_2$), hydrogen bromide (HBr), chlorine ($Cl_2$), methane ($CH_4$), argon (Ar), helium (He), carbon hydrogen fluorides ($C_xH_yF_z$), carbon fluorides ($C_xF_y$), and/or other desired gases under a variety of pressure and power conditions.

As describe herein, the pattern lines formed within the patterned structure 142 from the pattern transfer of the spacer pattern 134 to underlying layers have improved roughness parameters based upon the axial stress provided by the high stress films 402/404 deposited on the substrate 106. It is again noted that additional and/or different process steps to those shown can also be implemented with respect to the microelectronic workpiece being manufactured while still taking advantage of the techniques described herein.

It is further noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic workpiece" as used herein generically refers to the object being processed in accordance with the invention. The microelectronic workpiece may include any material portion or structure of a device, particularly a semiconductor or other electronics device, and may, for example, be a base substrate structure, such as a semiconductor substrate or a layer on or overlying a base substrate structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a microelectronic workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method to utilize stress in a substrate in a self-aligned multi-patterning (SAMP) process, the substrate having a frontside and a backside, the method comprising:
   depositing a high stress film on the frontside and the backside of the substrate, the high stress film providing biaxial stress to the substrate due to the deposition process for the high stress film;
   performing a SAMP process to form spacers in a spacer pattern; and
   transferring the spacer pattern to underlying layers to form a patterned structure, wherein the high stress film provides axial stress in at least one direction along a portion of the patterned structure during the transfer.

2. The method of claim 1, wherein the patterned structure includes pattern lines, wherein the high stress film provides axial stress in a longitudinal direction along the pattern lines, and wherein the axial stress is a stress of greater than 0.5 Giga Pascals (GPa).

3. The method of claim 2, wherein the pattern lines have a line width roughness (LWR) of less than 1.6.

4. The method of claim 2, wherein the pattern lines have a line width roughness (LWR) of less than 1.2.

5. The method of claim 2, wherein the axial stress is a stress of greater than 1.0 GPa.

6. The method of claim 5, wherein the pattern lines have an aspect ratio greater than 5.0.

7. The method of claim 2, wherein the axial stress is a stress of greater than 1.25 GPa.

8. The method of claim 7, wherein the pattern lines have an aspect ratio greater than 7.0.

9. The method of claim 1, wherein the patterned structure includes a feature size of less than 22 nanometers, and wherein the axial stress is a stress greater than 0.5 Giga Pascals (GPa).

10. The method of claim 1, wherein the patterned structure includes a feature size of less than 10 nanometers, and wherein the axial stress is a stress greater than 0.5 Giga Pascals (GPa).

11. The method of claim 1, further comprising controlling operating variables for the depositing to meet a target parameter for the biaxial stress.

12. The method of claim 1, further comprising controlling operating variables for the performing and transferring to ensure that the patterned structure meets target parameters for line roughness.

13. The method of claim 1, wherein the SAMP process comprises:
   performing a core definition process to form cores on the frontside of the substrate; and
   forming spacers in the spacer pattern based upon the cores.

14. The method of claim 13, wherein the forming spacers comprise:
   depositing a spacer layer over the cores;
   etching the spacer layer to form spacers; and
   performing a further etch to pull the cores and leave the spacers in the spacer pattern.

15. The method of claim 1, wherein the transferring comprising:
   etching the high stress film on the frontside of the substrate between the spacers; and
   etching the substrate between the spacers.

16. The method of claim 15, further comprising removing the spacers.

17. The method of claim 1, wherein the patterned structure includes pattern lines, wherein the patterned lines have a feature size of less than 10 nanometers, wherein the pattern lines have an aspect ratio of greater than 5.0, and wherein the axial stress is a stress of greater than 1.0 GPa.

18. The method of claim 1, wherein the patterned structure includes pattern lines, wherein the patterned lines have a feature size of less than 10 nanometers, wherein the pattern lines have an aspect ratio of greater than 7.0, and wherein the axial stress is a stress of greater than 1.25 GPa.

19. The method of claim 1, wherein the depositing comprises depositing a first high stress film on the backside of the substrate and depositing a second high stress film on the frontside of the substrate, wherein the second high stress film matches the first high stress film.

20. The method of claim 1, wherein the depositing comprises depositing a first high stress film on the backside of the substrate and depositing a second high stress film on the frontside of the substrate, wherein the second high stress film is different from the first high stress film.

* * * * *

UNITED STATES PATENT AND TRADEMARK OFFICE
CERTIFICATE OF CORRECTION

PATENT NO. : 10,734,228 B2  
APPLICATION NO. : 16/212144  
DATED : August 4, 2020  
INVENTOR(S) : Eric Chih-Fang Liu et al.

Page 1 of 2

It is certified that error appears in the above-identified patent and that said Letters Patent is hereby corrected as shown below:

On the Title Page

Column 1, page 2, item (56), Line 10, "2005/0277289 A1 12/2005 Ivagganer et al." should be --2005/0277289 A1 12/2005 Wagganer et al.--.

In the Specification

Column 1, Lines 16-17, "microelectronic workpieces, and in particular, methods for" should be --microelectronic workpieces and, in particular, methods for--.
Column 1, Line 52, "At these small features size and particularly as" should be --At these small feature sizes and particularly as--.
Column 3, Line 5, "This etch processes for the pattern" should be --These etch processes for the pattern--.
Column 5, Line 44, "further improve frontside patterns results by controlling" should be --further improve frontside pattern results by controlling--.
Column 8, Line 67, "the buffer chambers 389A-C can be adjusted by, e.g., by" should be --the buffer chambers 389A-C can be adjusted, e.g., by--.
Column 9, Line 16, "specific process plasma process conditions" should be --specific plasma process conditions--.
Column 9, Line 20, "processing apparatus may be configured to provided localize" should be --processing apparatus may be configured to provide localized--.
Column 10, Line 25, "including, but not limited silicon nitride" should be --including, but not limited to, silicon nitride--.
Column 10, Line 27, "parameters such that the deposited material meet a target" should be --parameters such that the deposited material meets a target--.
Column 11, Line 32, "ratios in the TABLE below are" should be --ratios in FIG. 6 are--.
Column 12, Line 24, "process and/or other etch or strip process" should be --process and/or other etch or strip processes--.
Column 12, Line 36, "including but not limited silicon nitride" should be --including but not limited to silicon nitride--.

Signed and Sealed this  
Twenty-seventh Day of October, 2020

Andrei Iancu  
*Director of the United States Patent and Trademark Office*

Column 12, Line 49, "In one embodiment, the spacer layer 122 is be deposited" should be --In one embodiment, the spacer layer 122 is deposited--.

Column 13, Lines 34-35, "It is further noted that reference throughout this specification to … means that" should be --It is further noted that references throughout this specification to … mean that--.

In the Claims

Column 16, Line 4, Claim 14, "The method of claim 13, wherein the forming spacers comprise" should be --The method of claim 13, wherein the forming spacers comprises--.